(12) United States Patent
Flower et al.

(10) Patent No.: US 11,312,053 B2
(45) Date of Patent: Apr. 26, 2022

(54) INTERNAL RELIEF VOID ARRANGEMENT FOR CASTING SYSTEM

(71) Applicant: HONEYWELL INTERNATIONAL INC., Morris Plains, NJ (US)

(72) Inventors: Scott Flower, Gilbert, AZ (US); Tho X. Bui, Phoenix, AZ (US); Christy Mihealsick, Tempe, AZ (US); Mark McGinnis, San Tan Valley, AZ (US)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 325 days.

(21) Appl. No.: 16/539,072

(22) Filed: Aug. 13, 2019

(65) Prior Publication Data

US 2021/0046683 A1 Feb. 18, 2021

(51) Int. Cl.
| | |
|---|---|
| *B29C 45/56* | (2006.01) |
| *B29C 48/91* | (2019.01) |
| *B29C 45/26* | (2006.01) |
| *B22D 19/00* | (2006.01) |
| *B22D 27/04* | (2006.01) |
| *B22D 25/02* | (2006.01) |
| *B22D 23/06* | (2006.01) |

(52) U.S. Cl.
CPC .......... *B29C 45/561* (2013.01); *B29C 45/263* (2013.01); *B29C 48/91* (2019.02); *B22D 19/00* (2013.01); *B22D 23/06* (2013.01); *B22D 25/02* (2013.01); *B22D 27/045* (2013.01); *B22F 2998/10* (2013.01)

(58) Field of Classification Search
CPC ..... B29C 45/561; B29C 45/263; B29C 48/91; B22F 2998/10; B22D 23/06; B22D 19/00; B22D 27/045; B22D 25/02
USPC ......................................................... 425/149
See application file for complete search history.

(56) References Cited

U.S. PATENT DOCUMENTS

| | | | |
|---|---|---|---|
| 9,364,888 B2 | 6/2016 | McBrien et al. | |
| 9,415,438 B2 | 8/2016 | McBrien et al. | |
| 9,718,127 B2 | 8/2017 | Xu | |
| 2006/0090871 A1 | 5/2006 | Snyder et al. | |
| 2010/0122789 A1 | 5/2010 | Piggush et al. | |
| 2015/0283614 A1* | 10/2015 | Wu .......................... | B22F 3/12 419/42 |
| 2015/0322799 A1* | 11/2015 | Xu ............................ | B22C 9/02 416/231 R |
| 2016/0059302 A1* | 3/2016 | McBrien ................... | B32B 1/08 164/9 |

(Continued)

*Primary Examiner* — Joseph S Del Sole
*Assistant Examiner* — Lawrence D. Hohenbrink, Jr.
(74) *Attorney, Agent, or Firm* — Lorenz & Kopf, LLP (57) ABSTRACT

A method includes providing a collection of particulate material and forming a first article therefrom. Forming the first article includes forming an outer shell with an outer surface that defines an outer periphery of the first article; forming a relief area of the first article that supports the outer shell, including forming a relief void in the relief area; and collecting a collection of the particulate material within the outer shell during formation of the first article. Moreover, the method includes encasing the first article with an outer member. The outer member defines an internal cavity with an internal surface that corresponds to the outer surface of the outer shell. The method further includes heating, which deforms the first article selectively at the relief void.

20 Claims, 8 Drawing Sheets

(56) References Cited

U.S. PATENT DOCUMENTS

2016/0319677 A1 11/2016 McBrien et al.
2018/0036796 A1* 2/2018 Mittendorf ............. B22D 23/06

* cited by examiner

INTERNAL RELIEF VOID ARRANGEMENT FOR CASTING SYSTEM

TECHNICAL FIELD

The present disclosure generally relates to manufacturing methods, systems, and parts formed therewith and, more particularly, relates to an internal relief void arrangement for a casting system, including manufacturing methods and parts formed therewith.

BACKGROUND

Parts may be manufactured using a variety of methods. Certain characteristics of the part may be affected by the manufacturing method used to make the part. For example, the geometry of the part, the surface roughness, the material characteristics, and/or other features may be dependent on the manufacturing methods that are employed.

Additionally, different manufacturing methods present certain challenges and limitations. Some methods may be more energy efficient than others. Some methods may be more labor intensive than others, may require expensive machinery, and more. These considerations should be taken into account when deciding how to manufacture parts.

There remains a need for improved manufacturing methods that have high efficiency. There also remains a need for methods that can be used to make complex parts accurately and repeatably. Other desirable features and characteristics of the present disclosure will become apparent from the subsequent detailed description and the appended claims, taken in conjunction with the accompanying drawings and the foregoing technical field and background.

BRIEF SUMMARY

In one embodiment, a method of manufacturing a part is disclosed. The method includes providing a collection of particulate material and forming a first article from the particulate material. Forming the first article includes forming an outer shell with an outer surface that defines an outer periphery of the first article. Forming the first article also includes forming a relief area of the first article that supports the outer shell, including forming a relief void in the relief area. Additionally, forming the first article includes collecting a collection of the particulate material within the outer shell during formation of the first article, wherein the collection has a lower density than that of the outer shell and the relief area. Moreover, the method includes encasing at least a portion of the outer shell of the first article with an outer member. The outer member defines an internal cavity with an internal surface that corresponds to the outer surface of the at least a portion of the outer shell. The method further includes heating the outer member and the first article and thermally expanding the first article within the outer member, which deforms the first article selectively at the relief void, wherein the first article melts into a molten mass within the internal cavity of the outer member. Additionally, the method includes solidifying the molten mass to form a second article within the internal cavity, wherein the second article corresponds to the internal surface of the outer member.

In another aspect, a manufacturing system for manufacturing a cast article is disclosed. The manufacturing system includes a rapid manufacturing device having a support bed that is configured to support a collection of particulate material. The rapid manufacturing device is configured to manufacture a first article from the particulate material, wherein the first article includes an outer shell, a relief area that supports the outer shell, and a collection of the particulate material collected within the outer shell. Also, the outer shell has an outer surface that defines an outer periphery of the first article. The relief area includes a relief void. The manufacturing system further includes an encasement device configured to form an outer member about at least a portion of the first article. The outer member defines an internal cavity that corresponds to the outer surface of the at least a portion of the outer shell. The manufacturing system further includes a heating device configured to heat the outer member and the first article and thermally expand the first article within the outer member, which deforms the first article selectively at the relief void, and eventually melt the first article into a molten mass within the internal cavity of the outer member. Additionally, the manufacturing system includes a solidification device configured to solidify the molten mass within the internal cavity, wherein the second article corresponding to the internal surface of the outer member.

BRIEF DESCRIPTION OF THE DRAWINGS

The present disclosure will hereinafter be described in conjunction with the following drawing figures, wherein like numerals denote like elements, and wherein.

DETAILED DESCRIPTION

The following detailed description is merely exemplary in nature and is not intended to limit the present disclosure or the application and uses of the present disclosure. Furthermore, there is no intention to be bound by any theory presented in the preceding background or the following detailed description.

Figure 1A:
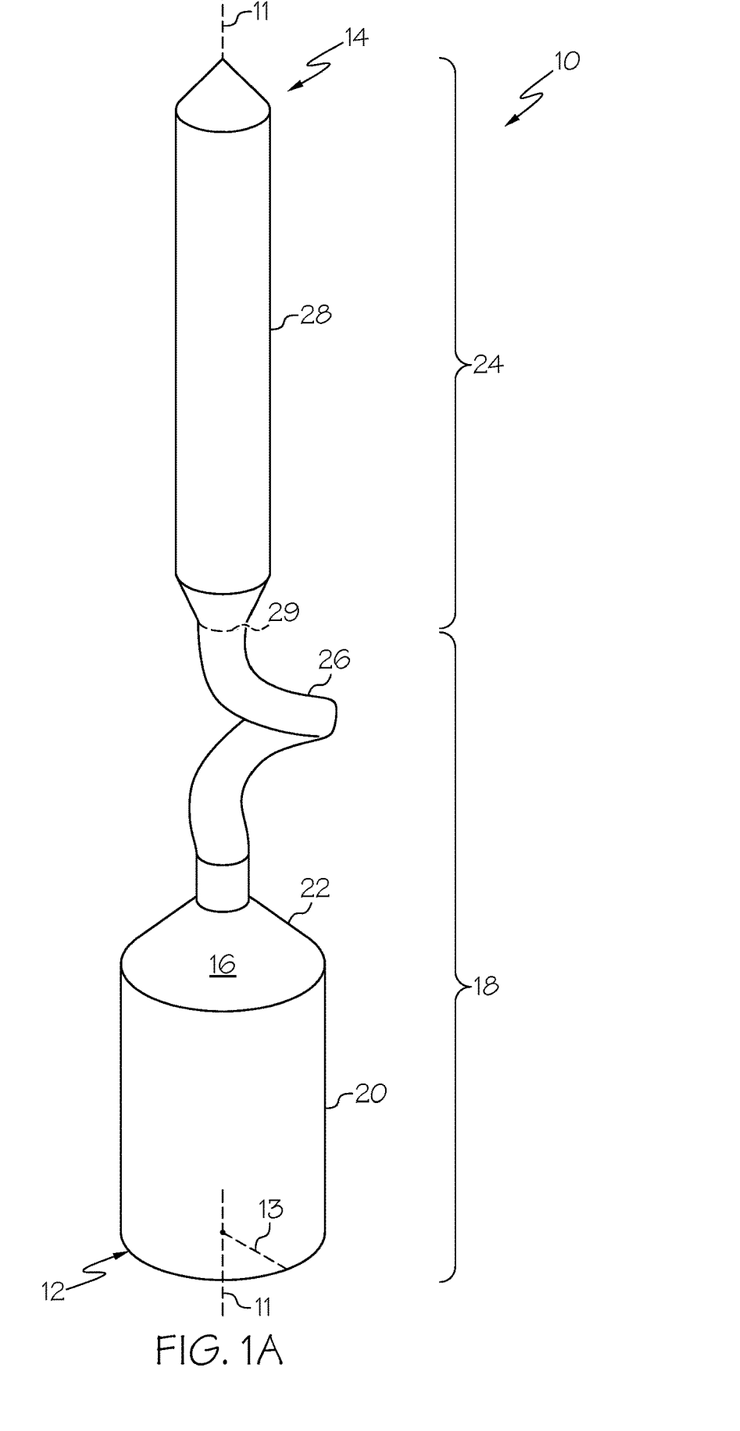
FIG. 1A is a perspective view of an example part formed according to a manufacturing method of the present disclosure.

Referring initially to FIG. 1A, a part 10 is shown according to exemplary embodiments of the present disclosure. As will be discussed, the part 10 may be formed in a specific and controlled manner. The part 10 may be formed using the system 100 represented schematically in FIG. 2 and according to the manufacturing method 1000 represented in FIG. 3. Accordingly, as will be discussed, the part 10 may be formed in an efficient and effective manner.

More specifically, rapid manufacturing techniques (e.g., additive manufacturing and other rapid prototyping techniques) may be used to form a first article 116 (FIG. 4) that corresponds to the part 10. A majority of the outer profile of the first article 116 may have the same shape, geometry, surface contour, dimensions, etc. as that of the part 10 (within reasonable manufacturing tolerances). Also, the first article 116 may be formed at a relatively low density compared to that of the part 10.

Figure 8:
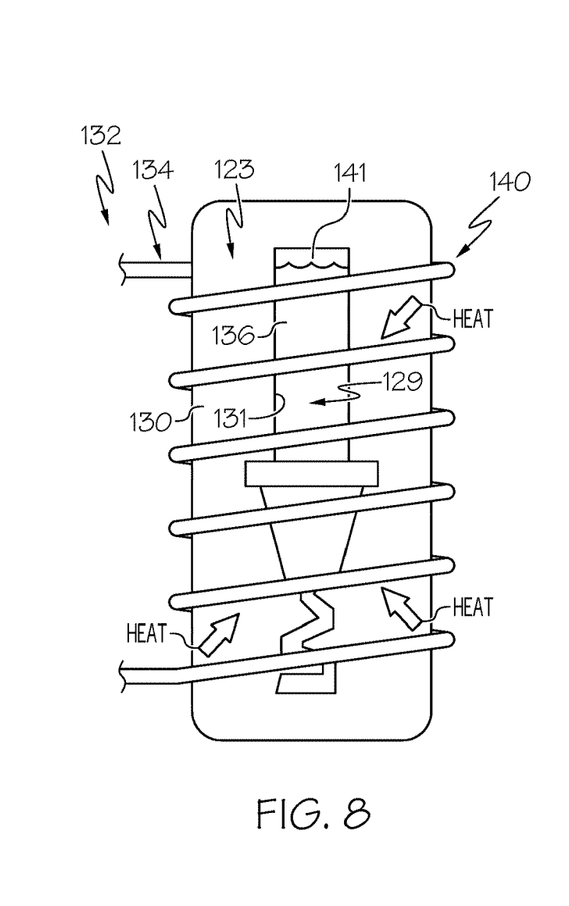
FIG. 8 is a schematic side view of a heating device, which is part of the manufacturing system of FIG. 2, and which is used in the manufacturing method of FIG. 3.
Figure 9:
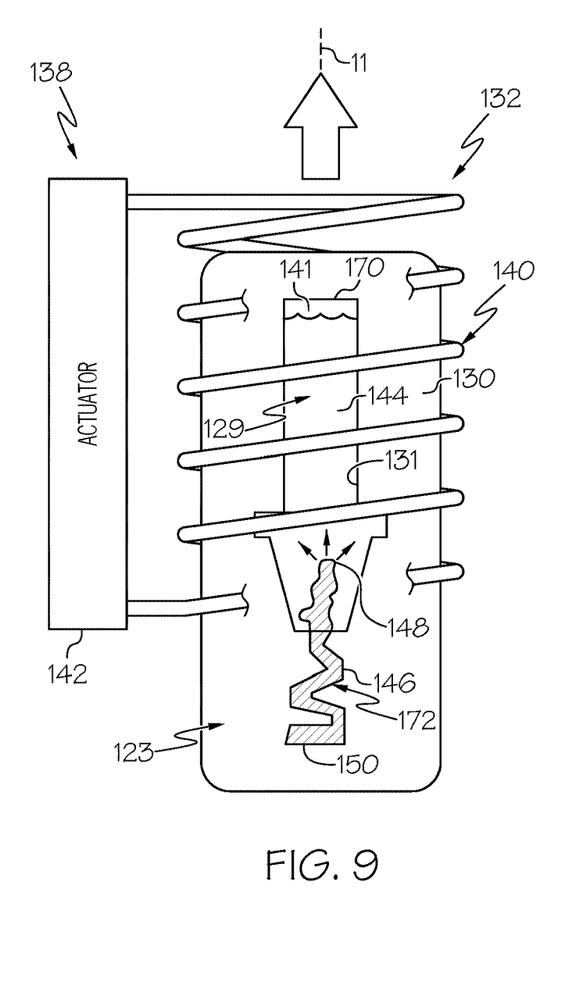
FIG. 9 is a schematic side view of a solidification device, which is part of the manufacturing system of FIG. 2, and which is used in the manufacturing method of FIG. 3.
Figure 10:
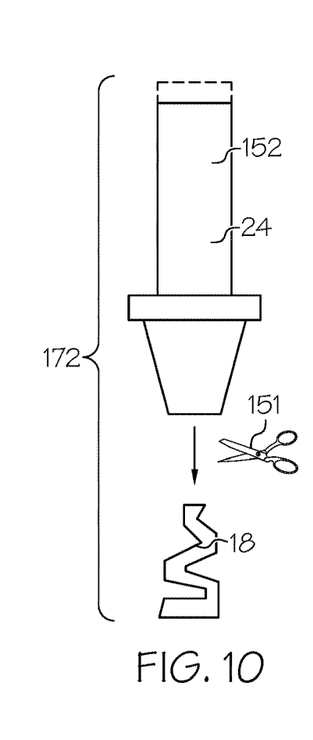
FIG. 10 is a schematic side view of a post-solidification device, which is part of the manufacturing system of FIG. 2, and which is used in the manufacturing method of FIG. 3.

Once the first article 116 is formed, an outer member 130 (FIG. 7) may be formed to encase the low-density first article 116. The outer member 130 may be formed from ceramic or other rigid material. Next, the first article 116 may be melted and re-solidified within the cavity of the outer member 130 (FIGS. 8-10). Thus, the part 10 may be solidified from the same material as the first article 116 and the part 10 may be formed (cast) within the outer member 130 in a selective, controlled, and predetermined manner. The part 10, the materials used to form the part 10, and methods of manufacturing the part 10 may be particularly configured for increasing manufacturability, for increasing manufacturing efficiency, etc. as will be discussed. In some embodiments, the part 10 may be directionally solidified as will be discussed in detail below. Accordingly, the material structure of the part 10 may include relatively few crystals and/or relatively few grain boundaries. Specifically, in some embodiments, the part 10 may have a single-crystal grain structure.

It will be appreciated that the terms "directionally solidified," "directional solidification," and other related terms are used generally herein to include solidification that occurs in a predetermined, selective, and controlled manner, and solidification occurs substantially along a predetermined direction. Thus, directional solidification methods of the present disclosure may be used to form a part with single-crystal grain structure in some embodiments. In other embodiments, directional solidification methods of the present disclosure may be used to form a part with multiple-crystal grain structure. Moreover, it will be appreciated that directional solidification is an optional feature of the present disclosure.

Manufacturing methods of the present disclosure may include one or more features that improve this so-called "foundry-less" casting process. For example, the first article 116 may be formed to include one or more features that relieve stress and strain on the outer member 130 during the heating and melting of the first article 116 within the outer member 130.

Specifically, in some embodiments, the first article 116 may be formed from particulate material. Energy may be applied to a select group of the particles to thereby attach the particles and rapidly form an outer wall, skin, or shell. This outer shell may extend about the first article 116 and may define the outer profile thereof. As this outer shell is formed, a second group of particles may be simultaneously collected therein. Thus, the first article 116 may be formed from the particulate material and may include a high density outer shell and a comparatively low-density collection of the particulate therein.

Figure 11:
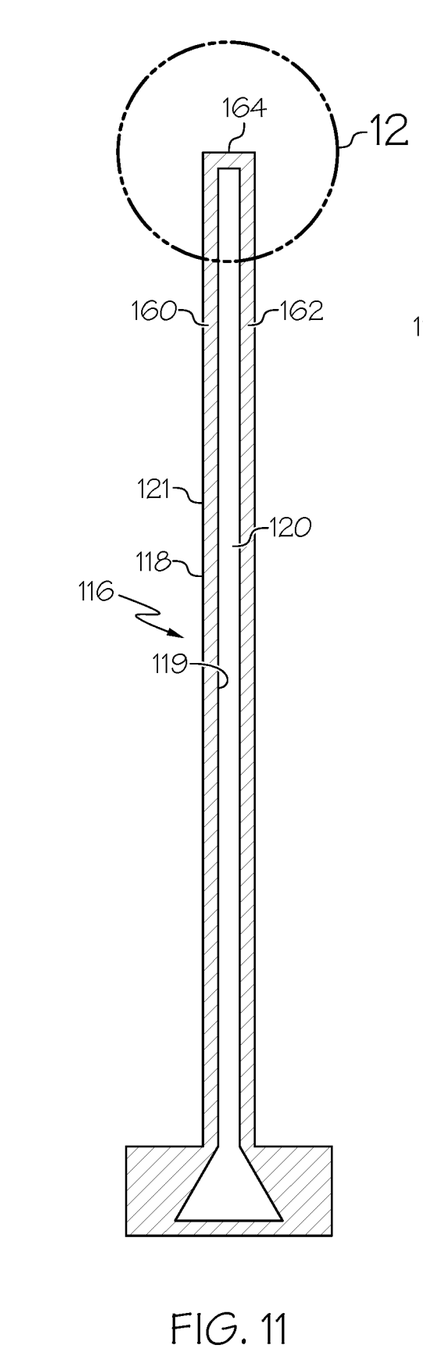
FIG. 11 is a cross sectional view of the first article shown according to additional embodiments of the present disclosure.
Figure 12:
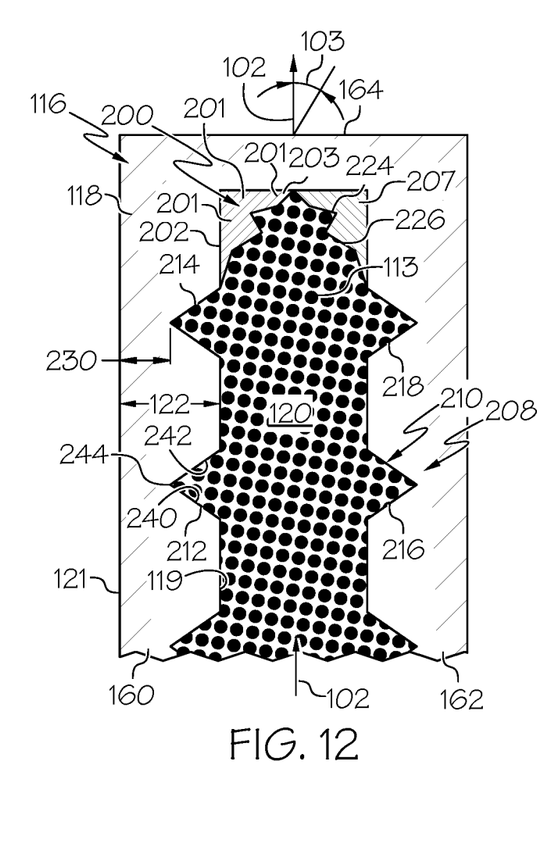
FIG. 12 is a cross sectional view of a portion of the first article of FIG. 11.
Figure 13:
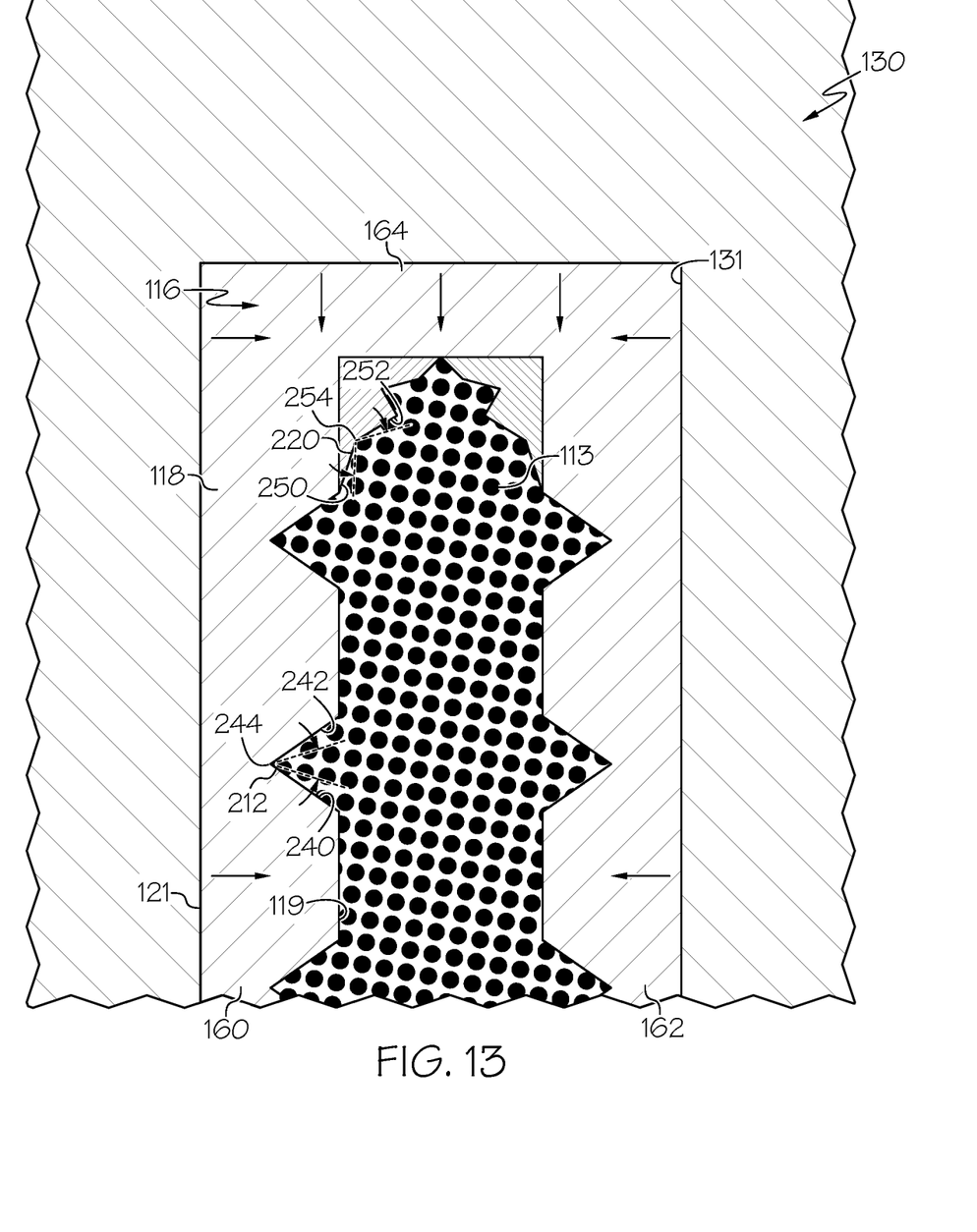
FIG. 13 is a cross sectional view of the portion of the first article of FIG. 11 encased within an outer member and shown during a heating process to illustrate selective and controlled deformation of the first article against the outer member according to example embodiments of the present disclosure.

Additionally, as represented in FIGS. 11-13, the outer shell of the first article 116 may be supported by a relief area. The relief area may include a relief void. The relief void may be a notch, groove, divot, or other aperture configured to buckle or collapse the outer shell during heating and melting of the first article 116. When heating the first article 116 within the outer member 130, the material of the first article 116 thermally expands. However, the relief voids reduce, eliminate, and/or ameliorate stress concentration and strain on the outer member 130 due to the thermal expansion of the material. The relief void may define a failure point or failure area of the outer shell and may be shaped and/or located to cause selective deformation of the first article 116 during the heating and melting thereof. The relief void may cause the outer shell to collapse, buckle, or otherwise move inward from the inner surface of the outer member 130. The first article 116 may be formed with a plurality (an arrangement) of relief voids that extend in one or more areas, and the relief voids define respective failure points in the first article 116 that cause it deform, collapse, or implode when thermally expanding. The relief void and/or the arrangement of relief voids may provide anisotropic properties to the outer shell of the first article 116 (i.e., better ability to withstand loads directed along one direction than loads directed along a different direction). Because the relief voids reduce stress concentrations and resultant damage to the outer member 130, the part 10 is formed with more precision, accuracy, and efficiency, and yield is increased. Parts 10 may be formed according to these methods with complex geometries, three-dimensional contours, and controlled microstructures.

Referring now to FIG. 1A, specific features of the part 10 will be discussed in greater detail. The part 10 may be a one-piece, unitary body. The part 10 may be substantially solid (i.e., not hollow). In additional embodiments, the part 10 may include one or more internal channels, flow passageways with an inlet and an outlet, enclosed pockets, cavities, or other apertures. The part 10 may define a longitudinal axis 11 and a radial axis 13. The part 10 may include a first end 12 and a second end 14, which are spaced apart relative to the longitudinal axis 11. The part 10 also includes an outer periphery 16 (i.e., outer surface).

As shown, the part 10 may include a first body portion 18 and a second body portion 24, which are joined end-to-end at an imaginary parting plane 29. The first body portion 18 may include a cylindrical portion 20 (i.e., a "base"), a frusto-conic portion 22, and a helical member 26 (i.e., a "pigtail" or "grain selector"). At least part of the first body portion 18 may also be referred to as a sprue portion of the part 10. The cylindrical portion 20 and frusto-conic portion 22 may be substantially centered about the longitudinal axis 11. The frusto-conic portion 22 may be disposed on an end of the cylindrical portion 20, opposite the first end 12 of the part 10. The helical member 26 may extend helically about the longitudinal axis 11 as it extends away from the frusto-conic portion 22. The second body portion 24 may include a cylindrical portion 28 that is centered on the longitudinal axis 11. The second body portion 24 may also be tapered at the second end 14 and may be referred to as a "slag" end.

Figure 2:
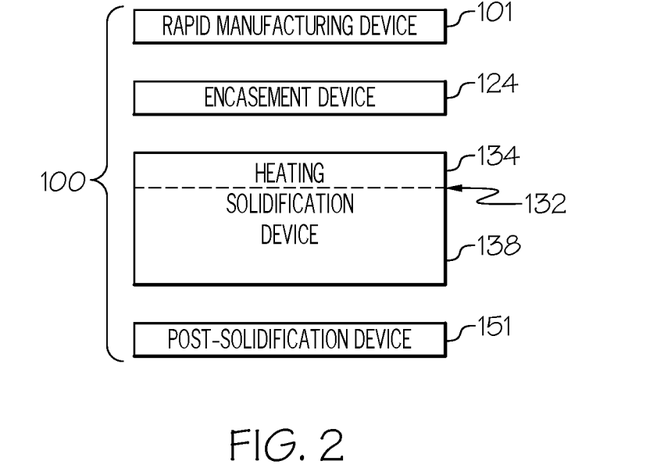
FIG. 2 is a functional block diagram of a manufacturing system configured to form the part of FIG. 1A and/or FIG. 1B.
Figure 3:
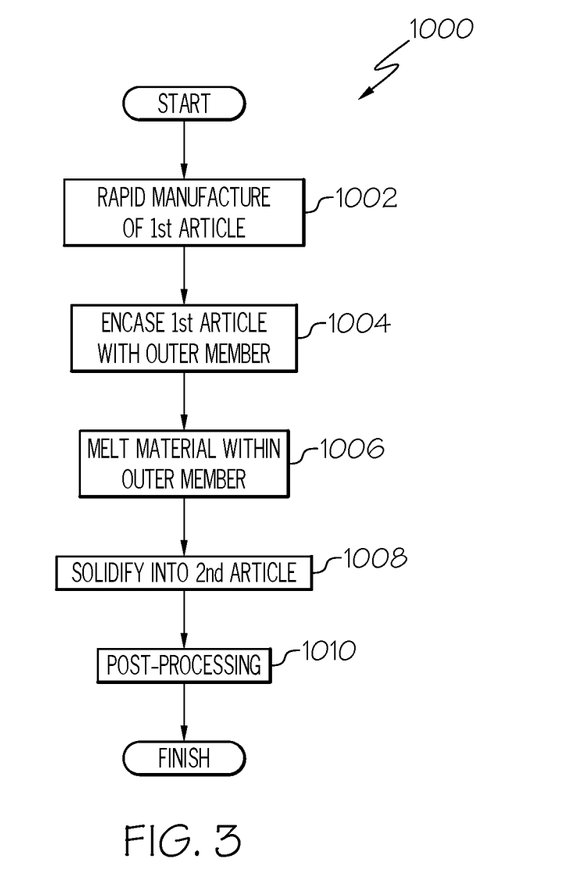
FIG. 3 is a flowchart illustrating a method of manufacturing the part of FIG. 1A and FIG. 1B.

It will be appreciated that the part 10 shown in FIG. 1A is merely an example of a variety of parts that may be manufactured using the system 100 of FIG. 2 and/or the method 1000 of FIG. 3. Thus, the shape, dimensions, or other features of the part 10 may differ from the embodiment shown in FIG. 1A without departing from the scope of the present disclosure.

Figure 1B:
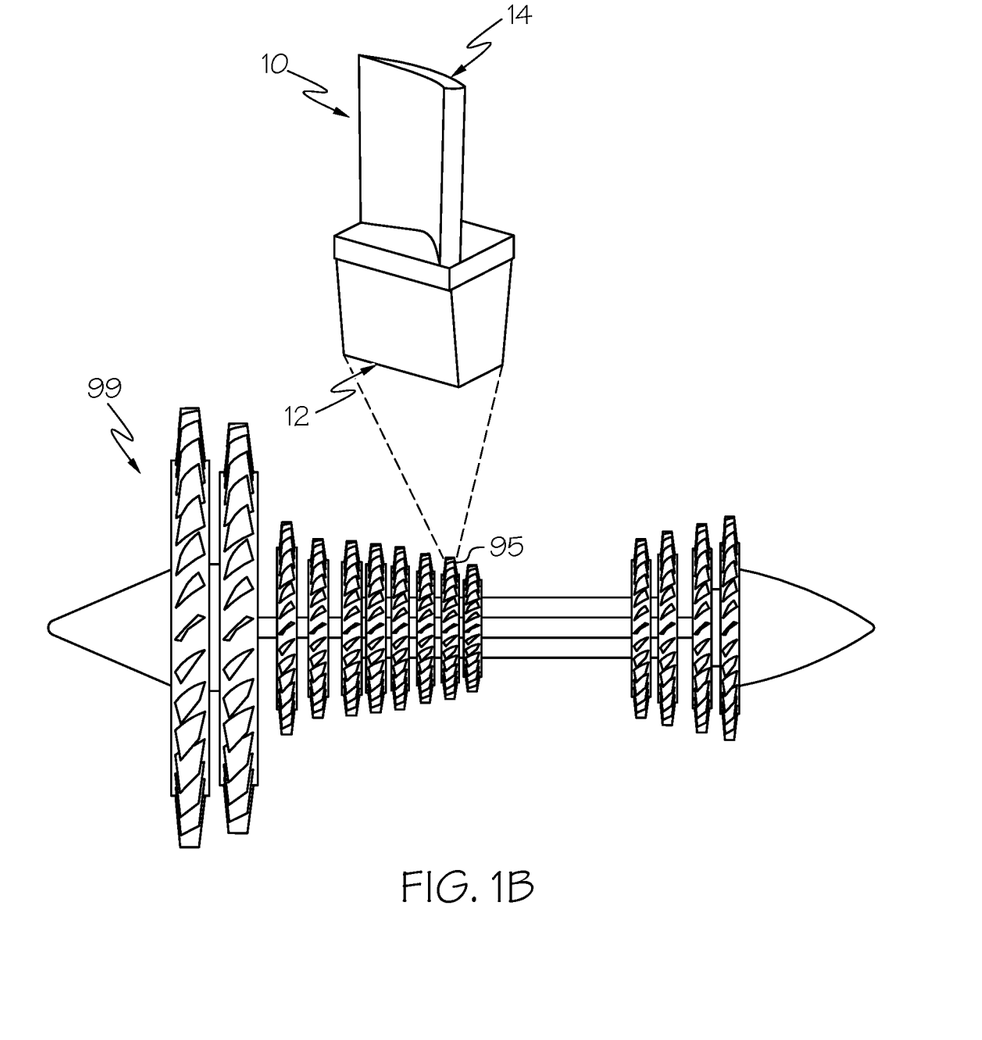
FIG. 1B is a schematic perspective view of the part according to additional embodiments of the present disclosure.

Another part 10 formed according to embodiments of the present disclosure is illustrated in FIG. 1B. As shown, the part 10 may be configured for use within a gas-turbine engine (e.g., a gas-turbine engine of an aircraft), the rotating group of which is indicated generally at 99. The part 10 may be configured for a compressor section or a turbine section of the engine. In some embodiments, the part 10 may be a compressor blade with a first end 12 configured as a mount that is attached to the rotating group 99 and a second end 14 that includes an airfoil-shaped profile. In other embodiments, the part 10 may be a stator vane, wherein the first end 12 is fixed relative to the rotating group 99 and the second end 14 defines an airfoil for directing fluid flow during operation of the engine. The part 10 may be formed and shaped for other uses as well without departing from the scope of the present disclosure.

The part 10 may be formed in a variety of ways without departing from the scope of the present disclosure. These methods may combine elements of rapid manufacturing, casting, directional solidification, and/or other manufacturing techniques. The part 10 (and/or the first article 116 used to form the part 10) may include features that are tailored for facilitating these manufacturing methods. For example, the part 10 may include a sprue, a chiller plate, or other features used in casting or casting-type operations. The first article 116 may also include one or more relief voids, which will be discussed in detail below.

The material of the part 10 may have certain temperature-dependent characteristics, such as a predetermined melting point. If the material is heated above this point, the material melts and becomes liquid, flowable, molten, etc. If the material is cooled below this point, the material solidifies and becomes solid, hardens, etc. In some embodiments, the material may be specifically configured for being melted, then solidified, then re-melted and re-solidified in a sequence.

Once solidified, the part 10 may have a material structure with a relatively low number of crystals and/or internal grain boundaries. For example, in some embodiments, the majority of the part 10 may have a single-crystal grain structure. Additionally, in some embodiments, all or substantially all of the part 10 may have a single-crystal grain structure. In other words, all or substantially all of the part 10 may be made from a single crystal of material. In addition, the part 10 may have a material structure with relatively few voids or cavities. Also, any voids or cavities that are included in the part 10 may be relatively small.

In the embodiment of FIG. 1A, the majority of the second body portion 24 may have single-crystal grain structure. The first body portion 18 and the slag portion at the second end 14 may be removed from the second body portion 24, leaving a single-crystal grain structure part. Although not shown, the part 10 of FIG. 1B may be formed along with body portions that are removed, such that the part 10 of FIG. 1B remains and includes single-crystal grain structure.

Referring now to FIG. 2, the system 100 for manufacturing the part 10 will be discussed in greater detail according to exemplary embodiments. Generally, the system 100 may include a rapid manufacturing device 101, an encasement device 124, a heating/solidification device 132, and a post-solidification device 151. As shown in FIG. 2, the heating/solidification device 132 may be embodied by a single machine, which performs both heating and solidification functions. However, in other embodiments, heating may be performed by a single machine, and solidification may be performed by a different machine. The system 100 may be employed for performing the manufacturing method 1000 illustrated in FIG. 3.

The method 1000 may begin at 1002, wherein the rapid manufacturing device 101 is used. Thus, the rapid manufacturing device 101 may decrease manufacturing time, for example, in comparison with traditional investment casting operations. The rapid manufacturing device 101 may be an additive manufacturing device. In these embodiments, the rapid manufacturing device 101 may be a three-dimensional (3-D) printer, a binder jet printer, a metal stereographic lithography (MSL) device, etc. In these embodiments, an article may be sequentially formed and built layer-by-layer over time. For example, the rapid manufacturing device 101 may sequentially deliver material and/or energy to predetermined points in space to produce the article. In other words, at 1002 of the method 1000, the article may be additively manufactured using any type of additive manufacturing process which utilizes layer-by-layer construction, including, but not limited to: binder jet printing; metal stereographic lithography (MSL); selective laser melting; direct metal deposition; direct metal laser sintering (DMLS); direct metal laser melting; electron beam melting; electron beam wire melting; micro-pen deposition in which liquid media is dispensed with precision at the pen tip and then cured; selective laser sintering in which a laser is used to sinter a powder media in precisely controlled locations; laser wire deposition in which a wire feedstock is melted by a laser and then deposited and solidified in precise locations to build the product; laser engineered net shaping; Direct Metal Electron Beam Fusion (DMEBF); and other powder consolidation techniques. Furthermore, the rapid manufacturing device 101 and 1002 of the system 100 may incorporate non-additive manufacturing techniques, such as metal injection molding (MIM), compression bonding, and/or selective laser melting (SLM). Other techniques may be employed as well without departing from the scope of the present disclosure.

Figure 4:
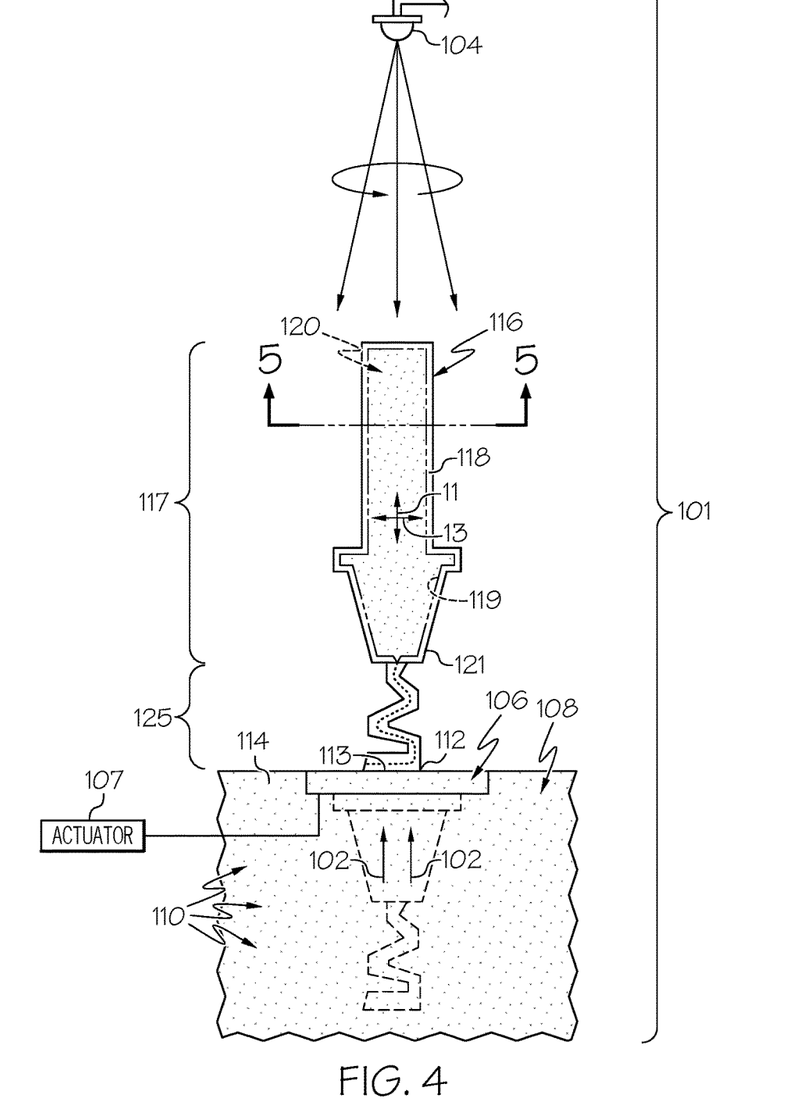
FIG. 4 is a schematic illustration of a rapid manufacturing device according to example embodiments of the present disclosure.

As represented in FIG. 4, the rapid manufacturing device 101 may be a direct metal laser fusion (DMLF) device and, at 1002 of the method, the device 101 is used to additively manufacture the first article 116. This is a laser-based rapid prototyping and tooling process by which complex parts may be directly produced by precision melting and solidification of metal powder (the "build material") into successive layers of larger structures, each layer corresponding to a cross-sectional layer of the first article 116. The first article 116 may correspond substantially in shape, scale, and dimension to the part 10 discussed above in relation to FIG. 1A or 1B. For example, the first article 116 of FIG. 4 may be formed to include a first portion 125 corresponding to the first body portion 18 of the part 10 of FIG. 1A. Likewise, the first article 116 of FIG. 4 may be formed to include a second portion 117 corresponding to the second body portion 24 of FIG. 1A. The first article 116 may also include an airfoil-shaped portion similar to the part 10 of FIG. 1B. The outer surface 121 of the first article 116 may define an outer periphery of the first article 116 and may correspond to that of the part 10. Thus, the outer surface 121 may have at least one area that has complex curvature (i.e., three-dimensional contour).

The rapid manufacturing device 101 includes an emitter 104. The emitter 104 may be configured to emit a laser, an electron beam, or other energy toward a support bed 106. The support bed 106 may support a collection of material 108. A condition of the material 108 may change as a result of exposure to the laser, electron beam, etc. from the emitter 104. The support bed 106 may be connected to an actuator 107. The actuator 107 may selectively change elevation of the support bed 106. The first article 116 may be formed layer by successive layer as the actuator 107 moves the support bed 106 until the first article 116 is completed. The first article 116 may be formed layer-by-layer along a build direction indicated by arrows 102. As shown, the build direction 102 is normal to the support bed 106. In some embodiments, the emitter 104 and/or the actuator 107 may be in communication with a computerized device (not shown). The computerized device may include computerized memory (RAM or ROM) and a processor. The processor may send control signals to the emitter 104 and/or the actuator 107 based on CAD data that is stored in the memory. The CAD data can correspond to the first article 116. Accordingly, the processor may control the emitter 104 and/or the actuator 107 to form the first article 116.

Figure 6:
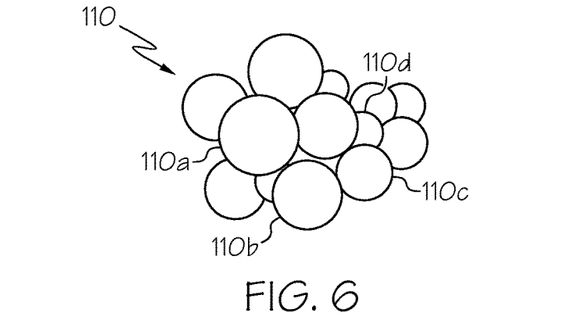
FIG. 6 is a schematic magnified view of materials used to form the first article of FIGS. 4 and 5.

In some embodiments, the material 108 may be a particulate material (i.e., a powder, a granulated material, etc.). More specifically, the material 108 may include a plurality of particles 110. As shown in detail in FIG. 6, the particles 110 may include substantially spherical particles 110a, 110b, 110c, 110d of various sizes. However, it will be appreciated that the particles 110 may be of any shape and size. The particles 110 may be of single crystal material structure in some embodiments. Additionally, in some embodiments, the particles 110 may be made from a metal alloy or super alloy. In one example, the particles 110 may be made from a nickel-based super alloy, an iron-based super alloy, a cobalt-based super alloy, or combinations thereof. For example, the particles 110 may be made from SC180, CMSX-4, or another single crystal alloy.

Thus, to form the first article 116, the emitter 104 emits focused energy at a first group 112 of particles 110, causing adjacent particles 110 within the first group 112 to melt and attach (fuse) together. The actuator 107 may simultaneously move the support bed 106 such that the first article 116 is formed layer-by-layer from the first group 112 of particles 110. Once formed, the first article 116 may be supported atop the support bed 106 as shown.

Figure 5:
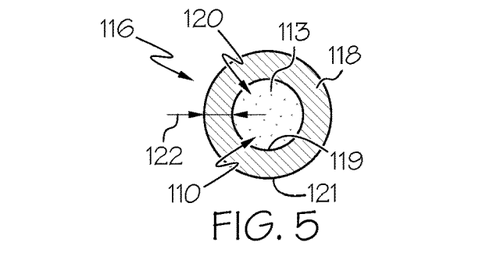
FIG. 5 is a cross sectional view of a first article formed with the rapid manufacturing device of FIG. 4, taken along the line 5-5 of FIG. 4.

In some embodiments, the first article 116 formed on the rapid manufacturing device 101 may be substantially hollow and/or may include one or more cavities therein. For example, as shown in the cross section of FIG. 5, the first article 116 may include an outer shell 118 (i.e., skin, outer wall, etc.) that defines a cavity 120 of the first article 116. The longitudinal cross section of the cavity 120 is shown in phantom in FIG. 4. The outer shell 118 may have a wall thickness 122 (FIG. 5), which is measured between the outer surface 121 and an inner surface 119 thereof. The wall thickness 122 of the outer shell 118 may be substantially consistent throughout the first article 116. In some embodiments, the thickness 122 of the outer shell 118 may be between approximately 0.003 inches and 1/32 inches in some embodiments. Also, in some embodiments, the outer shell 118 may extend continuously about the first article 116, forming a substantially complete enclosure in all directions.

In some embodiments, some of the particles 110 on the support bed 106 are attached together to form the outer shell 118 while other particles 110 remain loose and unaffected. The outer shell 118 may be formed such that those other, unaffected particles 110 are collected and contained within the cavity 120. Stated differently, the outer shell 118 is formed layer-by-layer, and as the outer shell 118 is progressively formed, unaffected, loose, and unattached particles (i.e., a second group of particles 113) are collected within the progressively growing cavity 120. The outer shell 118 eventually surrounds and at least partially encapsulates the loose particles 113 within the cavity 120. Stated differently, during the additive manufacturing process, the outer shell 118 may be formed layer-by-layer around the second group 113 of particles 110 such that the outer shell 118 ultimately contains the second group 113 of particles 110. In other words, energy from the emitter 104 affects the first group 112 of particles 110 to form the outer shell 118 without affecting the second group 113 of particles 110 such that the outer shell 118 is formed around the second group 113 of particles 110. Likewise, a third group 114 of particles 110 (FIG. 4) remain unaffected by energy from the emitter 104 during the additive manufacturing process, and the third group 114 of particles 110 remain disposed outside the first article 116.

The second group 113 of particles 110 may occupy a majority of (substantially all) the cavity 120. However, the second group 113 of particles 110 may be loosely packed within the cavity 120. Also, the first article 116 may have predetermined density and/or porosity characteristics. The outer shell 118 may have substantially high density and, thus, relatively low porosity. In contrast, the density of the second group 113 of particles 110 may be significantly lower than the density of the outer shell 118. Also, the porosity between the particles 110 within the second group 113 may be significantly higher than the porosity of the outer shell 118. By way of example, the outer shell 118 may have approximately 100% density and approximately 0% porosity, whereas the second group 113 of particles 110 may have approximately 65% density and approximately 35% porosity. In total, the density of the first article 116 (i.e., the density of the outer shell 118 and the second group 113 of particles 110 taken together) may be less than approximately 85%. Also, the porosity of the first article 116 may be greater than approximately 15%. These characteristics may provide certain benefits. For example, as will be explained in detail below, the material of the first article 116 is heated and cooled during the method 1000. Because the first article 116 has these predetermined density/porosity characteristics, the thermal expansion of the material of the first article 116 may be controlled.

The first article 116 may be formed using other techniques. For example, instead of fusing the particles 110 together to form the outer shell 118, a binder material may be used to attach the first group 112 of particles 110 together. This may be used with particles 110 made of materials considered "un-sinterable" or "un-weldable," such as MAR-M247, or Haynes 230. These materials may be susceptible to cracking, void formation as an article is formed; however, the methods 1000 of the present disclosure may include features for avoiding such results.

Figure 7:
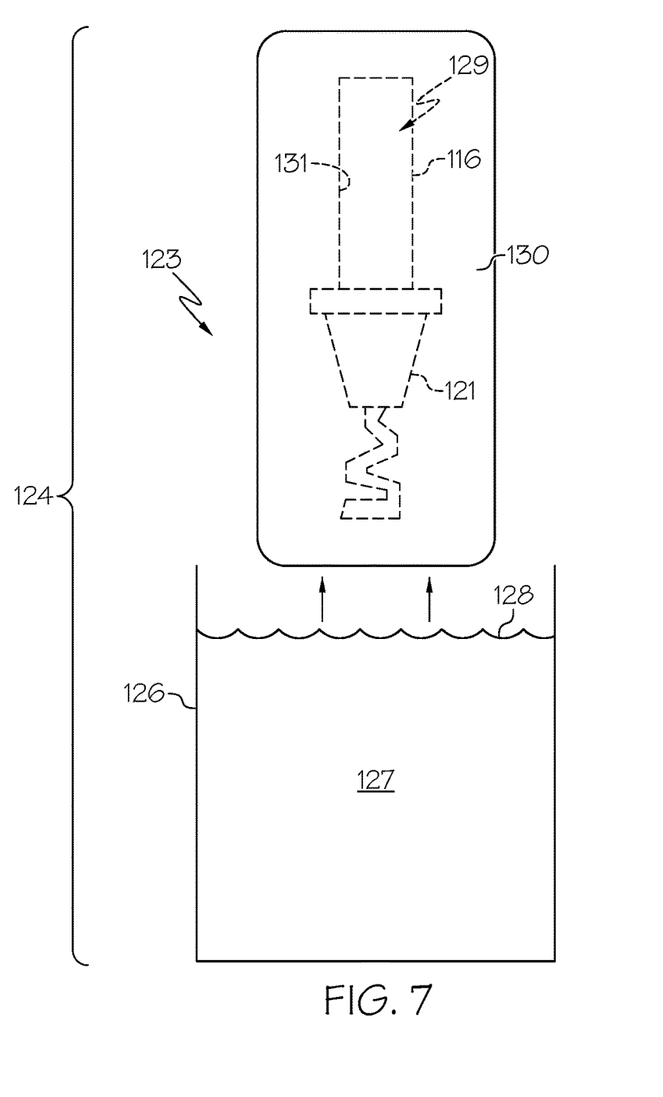
FIG. 7 is a schematic side view of an encasement device, which is part of the manufacturing system of FIG. 2, and which is used in the manufacturing method of FIG. 3.

Once the first article 116 is formed, the method 1000 may continue to 1004, wherein the first article 116 is encased by an outer member 130 as represented in FIG. 7. Specifically, the first article 116 may be transported to a container 126.

The container 126 may contain a slurry 128 of outer member material 127. The outer member material 127 is a ceramic material in some embodiments. The outer member material 127 may be, for example, silica, alumina, zircon, cobalt, mullite, kaolin, and mixtures thereof. The outer member material 127 generally has a melting point that is greater than the melting point of the particles 110.

The first article 116 may be exposed to the outer member material 127, for example, by dipping the first article 116 into the outer member material 127, by spraying the outer member material 127 onto the first article 116, etc. In some embodiments, a relatively thin coating may be applied to the outer surface 121 of the first article 116 before exposure to the outer member material 127. For example, the first article 116 may be coated with an organic material (e.g., wax or varnish) or with an inert ceramic coating. The article 116 may be exposed to the slurry 128 repeatedly for as many times as necessary to form the outer member 130 with an acceptable thickness. The outer member material 127 may be cured about the first article 116 to form the outer member 130 with solid and rigid properties.

In some embodiments, the outer member 130 may encase an entirety of the first article 116, such that the entire outer surface 121 of the first article 116 is covered by the outer member 130 and an inner wall 131 of an internal cavity 129 substantially conforms to a shape of the first article 116. In other embodiments, the outer member 130 may partially encase the first article 116 (e.g., may encase a majority of the first article 116). In these latter embodiments, the outer member 130 may be formed such that a portion of the first article 116 is exposed and/or protrudes from the outer member 130. Still further, the outer member 130 may be formed with at least one hole that exposes the first article 116.

Once hardened, the inner wall 131 corresponds to the outer surface 121 of the first article 116. Also, the outer member 130 contains the first article 116 as well as the second group 113 of particles 110 disposed within the first article 116. In other words, an encasement 123 may be formed. It will be appreciated that the encasement 123 includes the outer member 130 and any material contained within the internal cavity 129. Thus, in the embodiment of FIG. 7, the encasement 123 includes the outer member 130, the first article 116, as well as the second group 113 of particles 110 contained within the first article 116.

Next, the method 1000 may continue at 1006, wherein the encasement 123 may be transported to the heating/solidification device 132 represented in FIG. 8. In some embodiments, the heating/solidification device 132 may include a heating device 134. The heating element 140 is represented in FIG. 8 (and in FIG. 9) as extending helically about and surrounding the outer member 130. The heating element 140 may be an electrically resistive element that provides heat to the encasement 123 in some embodiments. Also, the heating element 140 may provide radiant heat, inductive heating, or another type. During operation, the heating element 140 may provide heat to the outer member 130 as well as the material therein. The heating device 134 may heat the encasement 123 to melt the material within the internal cavity 129, turning this material molten and flowable while the outer member 130 remains solid. Specifically, the material of the first article 116 as well as the second group 113 of particles 110 may melt together to form a molten mass 136. The molten mass 136 may be contained by the inner wall 131 of the outer member 130. Additionally, if a coating was applied to the first article 116, that coating may evaporate and vent out of the outer member 130. Otherwise, the coating may become part of the outer member 130.

In some embodiments, the volume of the molten mass 136 may be less than the volume of the internal cavity 129. As discussed above, the first article 116 may contain the second group 113 of particles 110. Thus, the material may melt, and cause a pocket 141 to form within the cavity 129 as shown in FIG. 8. It will be appreciated that the material of the first article 116 may thermally expand as it melts into the molten mass 136. Therefore, the density and porosity of the first article 116 (described in detail above) may allow the material to thermally expand within the internal cavity 129 without damaging the outer member 130. In other words, there is enough room within the cavity 129 for the material to melt and thermally expand without damaging the outer member 130 because of the density and porosity characteristics of the first article 116. Additional features for managing issues related to thermal expansion of the materials are discussed below.

Next, the method 1000 may continue to 1008, and directional solidification processes (e.g., zone refinement processes) may be performed as represented in FIG. 9. In some embodiments, the heating element 140 may be used, in part, as a solidification device 138 for directionally solidifying the molten mass 136. The solidification device 138 may also include an actuator 142, which is operatively connected to the heating element 140. The actuator 142 may be a hydraulic actuator in some embodiments. Also, the actuator 142 may be a linear actuator in some embodiments. The actuator 142 may be configured to move the heating element 140 relative to the encasement 123. The actuator 142 may also be configured to move the encasement 123 relative to the heating element 140 in some embodiments. Specifically, as shown in the FIG. 9, the actuator 142 may move the heating element 140 relative to one end of the encasement 123, causing the molten mass 136 adjacent a sprue end 150 of the cavity 129 to cool initially. Accordingly, a zone of solidified material 146 forms. Additionally, in some embodiments, the process may include using a starter seed or grain selector to enable a single crystal to form. It will be appreciated that the leading edge 148 may be a barrier between the solidified material 146 and a remaining molten portion 144 of the molten mass 136.

The zone of solidified material 146 may grow and the leading edge 148 may proceed through the cavity 129, generally along the longitudinal axis 11 toward an opposing end 170 of the cavity 129. Also, the zone of solidified material 146 may grow until the molten mass 136 is fully solidified within the internal cavity 129. Once solidified, the material forms a second article 172 that corresponds substantially to the inner wall 131 of the internal cavity 129. It will be appreciated, however, that the pocket 141 may remain within the internal cavity 129.

Directionally solidifying the molten mass 136 in the outer member 130 may form the second article 172 as both of a single crystal structure and of substantially the same shape as the first article 116. Additionally, the second article 172 may densify and may be substantially free of voids, contaminates, or other defects. For example, when directionally solidifying the second article 172 using a starter seed or grain selector, contaminates in the molten mass 136 may be pushed, or collected, by the leading edge 148 into a common area of the second article 172, which may then be removed and scrapped.

Finally, with reference to FIG. 3, the method 1000 may continue to 1010, wherein post-processing of the second article 172 occurs as represented in FIG. 10. The second article 172 may be removed from the outer member 130 (e.g., by breaking the outer member 130 or otherwise removing the second article 172 from the outer member 130). Then, in some embodiments, the post-solidification device 151 may be used to remove the first body portion 18 (i.e., the trim portion) of the second article 172 from the second body portion 24. Other post-processing may be performed, such as other cutting operations, polishing operations, and more.

Referring now to FIGS. 11-13, additional details about the manufacturing system 100, the manufacturing method 1000, and the parts formed therewith will be discussed. As discussed above, the method 1000 (FIG. 3) may begin at 1002, wherein the rapid manufacturing device 101 (FIG. 2) forms the first article 116 (FIGS. 11 and 12). The first article 116 may be formed with the outer shell 118. As discussed above, the outer shell 118 may include the outer surface 121 and the inner surface 119, which defines the cavity 120 containing the loose particulate of the second group of particles 113.

FIG. 12 illustrates a portion of the first article 116. This portion may be a relatively thin portion (e.g., an airfoil-shaped portion) as compared to other portions of the first article 116. As shown, the outer shell 118 may include a first wall 160 and a second wall 162 that extend substantially along the build direction 102 and that are separated apart with an overhang part 164 extending therebetween and transverse (e.g., perpendicular to) the build direction 102.

During 1002 of the method 1000, the first article 116 may be formed with one or more interior support structures 200. The interior support structures 200 may be configured for supporting the outer shell 118, for example, by supporting overhanging parts during an additive manufacturing process. In some embodiments, the interior support structures 200 may include a plurality of first elongate support members 201 having respective first ends 202 and second ends 203. The elongate support members 201 may extend through the interior cavity 120, between different areas of the inner surface 119 of the outer shell 118. As represented in FIG. 12, the first ends 202 may be fixed to the first wall 160, and the second ends 204 may be fixed to the overhang part 164. The elongate support members 201 may also extend at an acute angle 103 (e.g., at most forty-five degrees) relative to the build direction 102. The first article 116 may further include a plurality of second elongate support members 207 that extend between the second wall 162 and the overhang part 164. It will be appreciated that the elongate support members 201, 207 may extend in other directions to support the overhang part 164 (e.g., by extending in or out of the plane of the paper of FIG. 12, by curving through the cavity 120, etc.). Collectively, the interior support structures 200 may support the overhang part 164, during the layer-by-layer growth and formation of the overhang part 164 along the build direction 102. Thus, the first article 116 can be self-supporting, strong, and robust.

The interior support structures 200 may be formed during an additive manufacturing process. Specifically, the interior support structures 200 may be formed layer-by-layer (from the first group of particles 113) simultaneously with the outer shell 118. Also, the interior support structures 200 may be formed to have lower density (higher porosity) than the outer shell 118. For example, elongate support members 201 may be interconnected in a lattice-type arrangement, and the elongate support members 207 may be interconnected in a lattice-type arrangement as well. Moreover, it will be appreciated that the interior support structures 200 may have higher density (lower porosity) than the collection of the second group of particles 113 collected within the cavity 120.

The first article 116 may also be formed to include a relief area 208 as well. The relief area 208 may be formed to support the outer shell 118. The relief area 208 may also include one or more relief voids. For example, the relief area 208 may include a relief void arrangement 210, which comprises a first relief void 212, a second relief void 214, a third relief void 216, a fourth relief void 218, a fifth relief void 220, a sixth relief void 222, a seventh relief void 224, and an eighth relief void 226. In some embodiments, the relief voids 212-226 may be formed as relief grooves that are elongated and that extend along an axis (into and/or out of the page in FIG. 12). Also, the relief voids 212-226 may be open to the cavity 120 and the second group of particles 113 collected therein. As will be discussed, the relief voids 212-226 may be shaped, located, and positioned on the first article 116 in the arrangement 210 to ensure that thermal expansion of the material of the first article 116 does not overstress or overstrain the outer member 130.

In some embodiments, the relief voids 212-226 may have a sawtooth cross sectional shape, although other shapes are within the scope of the present disclosure. The first relief void 212, for example, may be defined by a first planar surface 240 and a second planar surface 242, which intersect along a corner junction 244. Likewise, the fifth relief void 220 may be defined by a first planar surface 250 and a second planar surface 252 that are joined along a corner junction 254. The other relief voids 212-226 may be similarly shaped and may include corner junctions.

The relief void arrangement 210 may include one or more outer shell relief voids, such as the first, second, third, and fourth relief voids 212, 214, 216, 218, which are formed in on the inner surface 119 of the outer shell 118. Furthermore, the relief void arrangement 210 may include one or more support structure relief voids 226, such as the fifth, sixth, seventh, and eighth relief voids 220, 222, 224, 226, which are formed in a cavity-facing surface of the support structures 200. The outer shell relief voids 212, 214, 216, 218 may be formed on the inner surface 119 to reduce the wall thickness of the shell 118 at select areas. The support structure relief voids 226 may be included to ensure collapse of the overhang part 164 toward the interior of the cavity 120 when the first article 116 is melted. There may be a series of relief voids 212-226 on the inner surface 119 and/or in the support structures 200 as shown in FIG. 12.

The relief voids 212-226 may be arranged about select areas of the first article 116 to cause the first article 116 to load the outer member 130 in a predictable and selective fashion due to thermal expansion. For example, a higher concentration of relief voids 212-226 may be included where the density of the first article 116 is relatively high (i.e., where the porosity of the part is relatively low). These are areas that might be prone to putting high stress and/or strain on the outer member 130 during re-melt; however, the relief void arrangement 210 at this area ameliorates these concerns and reduces stress concentrations on the outer member 130.

As shown in FIG. 12, the wall thickness of the outer shell 118 can be reduced at the corner junctions 244, 254 of the relief voids 212, 226. Specifically, the wall thickness 230 at the corner junction of the relief void 214 may be less than the wall thickness 122 at other areas of the outer shell 118. In some embodiments, the wall thickness 230 at the relief voids 212-226 may be, at most, half of the wall thickness 122 at areas spaced away from the relief voids 212-226 (e.g., at intermediate areas of the shell 118 disposed between two adjacent relief voids 212-226). For example, in some embodiments, the wall thickness 230 at the relief voids 212-226 may be approximately 0.010 inches and the wall thickness 122 may be approximately 0.030 inches.

Once the first article 116 is formed (at 1002 of the method 1000), the outer member 130 may be formed so as to encase the first article 116. Then, as represented in FIG. 13, the outer member 130 and the first article 116 therein may be heated. The material of the first article 116 thermally expands at a rate higher than that of the outer shell 118. Accordingly, the first article 116 exerts an outwardly directed force on the inner wall 131 of the outer member 130. The outer member 130, in turn, exerts an inwardly directed force on the outer shell 118.

As represented in FIG. 13, thermal expansion of the first article 116 causes the outer shell 118 to deform in a selective and predictable fashion. For example, the first planar surface 240 and the second planar surface 242 may expand generally toward each other and, in some embodiments, rotate, buckle, or otherwise deform about the corner junction 244. The corner junction 244 can, in effect, generate a stress concentration that causes this buckling action during thermal expansion of the first article 116. Likewise, as represented in FIG. 13, the first planar surface 250 and the second planar surface 252 may deform (buckle) about the corner junction 254, and the other relief voids 212-226 may similarly deform as well. Accordingly, the stress and strain on the outer member 130 may remain relatively low, and the part 10 may be formed more precisely.

Once the material of the first article 116 is melted, it may be re-solidified at 1008 of the method 1000. Then, the post-processing of 1010 of the method 1000 may be performed to complete the method 1000.

It will be appreciated that the method 1000 and system 100 of the present disclosure increases manufacturing efficiency. The part 10 may be formed with relatively complex features (e.g., three-dimensionally curved outer surfaces, etc.). Also, the part may have single crystal grain structure. Accordingly, the part may be included in a gas-turbine engine, and its single crystal grain structure may increase efficiency and/or increase the operating life of the engine.

Additionally, the part may be formed relatively quickly using the method 1000 and system 100 of the present disclosure. For example, the additive manufacturing represented in FIGS. 4 and 5 may be completed quickly because the outer shell 118 is formed additively, leaving the first article 116 hollow. However, the second group 113 of particles 110 remain within the cavity 120 of the first article 116 to be melted later during the manufacturing method 1000. Accordingly, instead of additively manufacturing the entire first article 116, the outer shell 118 is formed, saving manufacturing time.

The method 1000 and system 100 may also reduce manufacturing costs. For example, the cost of making mold tooling may be avoided. Also, costs associated with traditional casting (i.e., making a mold, dewaxing, and casting) may be avoided.

Additionally, the outer member 130 is unlikely to fracture or otherwise fracture during the method 1000. For example, even if there are different rates of thermal expansion between the outer member 130 and the material within the internal cavity 129, the outer member 130 is unlikely to fracture. This is because the first article 116 has relatively low density due to the loosely packed second group 113 of particles 110 within the first article 116. Also, the relief void arrangement 210 provides selective and controlled thermal deformation of the outer shell 118; thereby protecting the outer member 130 from excess strain and stress concentrations.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the present disclosure in any way. Rather, the foregoing detailed description will provide those skilled in the art with a convenient road map for implementing an exemplary embodiment of the present disclosure. It is understood that various changes may be made in the function and arrangement of elements described in an exemplary embodiment without departing from the scope of the present disclosure as set forth in the appended claims.

What is claimed is:

1. A method of manufacturing a part comprising:
   providing a particulate material;
   forming a first article from the particulate material comprising:
      forming an outer shell with an outer surface that defines an outer periphery of the first article;
      forming a relief area of the first article that supports the outer shell, including forming a relief void in the relief area; and
      collecting a collection of the particulate material within the outer shell during formation of the first article, the collection having a lower density than that of the outer shell and the relief area;
   encasing at least a portion of the outer shell of the first article with an outer member, the outer member defining an internal cavity with an internal surface that corresponds to the outer surface of the at least a portion of the outer shell;
   heating the outer member and the first article and thermally expanding the first article within the outer member, which deforms the first article selectively at the relief void, the first article melting into a molten mass within the internal cavity of the outer member; and
   solidifying the molten mass to form a second article within the internal cavity, the second article corresponding to the internal surface of the outer member.

2. The method of claim 1, wherein forming the relief area includes forming a relief groove in the relief area.

3. The method of claim 2, wherein forming the relief groove includes forming the relief groove to have a sawtooth cross sectional shape.

4. The method of claim 1, wherein the outer shell includes the outer surface and an inner surface, the inner surface defining an interior cavity that contains the collection of the particulate material;
   wherein forming the relief area includes forming the relief area on the outer shell and forming the relief void on the inner surface of the outer shell.

5. The method of claim 4, wherein the outer shell defines a first wall thickness at the relief area and defines a second wall thickness at an area that is spaced apart at a distance from the relief area; and
   wherein the first wall thickness is, at most, half of the second wall thickness.

6. The method of claim 1, wherein the outer shell includes the outer surface and an inner surface, the inner surface defining an interior cavity that contains the collection of the particulate material;

wherein forming the first article includes forming an interior support structure extending through the interior cavity from a first area of the inner surface to a second area of the inner surface; and wherein forming the relief area includes forming the relief area in the interior support structure.

7. The method of claim 6, wherein forming the first article includes forming a series of the relief areas along the interior support structure.

8. The method of claim 7, wherein forming the outer shell includes additively forming a wall along a build direction and forming an overhanging part that extends transverse to the build direction; and wherein forming the interior support structure includes forming the interior support structure to extend between the wall and the overhanging part.

9. The method of claim 1, wherein forming the outer shell includes forming the relief void to be open to the collection of the particulate material within the outer shell.

10. The method of claim 1, wherein forming the relief void includes forming a first planar inner surface and a second planar inner surface that intersect along a corner junction.

11. A manufacturing system for manufacturing a cast article, the manufacturing system comprising:
   a rapid manufacturing device having a support bed that is configured to support a particulate material, the rapid manufacturing device configured to manufacture a first article from the particulate material, the first article including an outer shell, a relief area that supports the outer shell, and a collection of the particulate material collected within the outer shell, the outer shell having an outer surface that defines an outer periphery of the first article, the relief area including a relief void;
   a container for containing an outer member material configured to form an outer member about at least a portion of the first article, the outer member defining an internal cavity that corresponds to the outer surface of the at least a portion of the outer shell;
   a heating device with a heating element configured to heat the outer member and the first article and thermally expand the first article within the outer member, which deforms the first article selectively at the relief void, and eventually melt the first article into a molten mass within the internal cavity of the outer member; and
   a solidification device with a support configured to support the outer member with the molten mass therein while the molten mass solidifies into a second article within the internal cavity, the second article corresponding to the internal surface of the outer member.

12. The manufacturing system of claim 11, wherein the rapid manufacturing device is configured to form the relief area with the relief void defining a relief groove.

13. The manufacturing system of claim 12, wherein the rapid manufacturing device is configured to form the relief groove with a sawtooth cross sectional shape.

14. The manufacturing system of claim 11, wherein the rapid manufacturing device is configured to form the outer surface and an inner surface of the outer shell, the inner surface defining an interior cavity that contains the collection of the particulate material; and wherein the rapid manufacturing device is configured to form the relief area on the outer shell and form the relief void on the inner surface of the outer shell.

15. The manufacturing system of claim 14, wherein the rapid manufacturing device is configured to form the outer shell with a first wall thickness at the relief area and a second wall thickness at an area that is spaced apart at a distance from the relief area; and wherein the first wall thickness is, at most, half of the second wall thickness.

16. The manufacturing system of claim 11, wherein the rapid manufacturing device is configured to form the outer surface and an inner surface, the inner surface defining an interior cavity that contains the collection of the particulate material;

wherein the rapid manufacturing device is configured to form an interior support structure extending through the interior cavity from a first area of the inner surface to a second area of the inner surface; and wherein forming the relief area includes forming the relief area in the interior support structure.

17. The manufacturing system of claim 16, wherein the rapid manufacturing device is configured to form a series of the relief areas along the interior support structure.

18. The manufacturing system of claim 17, wherein forming the outer shell includes additively forming a wall along a build direction and forming an overhanging part that extends transverse to the build direction; and wherein the rapid manufacturing device is configured to form the interior support structure to extend between the wall and the overhanging part.

19. The manufacturing system of claim 11, wherein the rapid manufacturing device is configured to form the outer shell with the relief void open to the collection of the particulate material within the outer shell.

20. The manufacturing system of claim 11, wherein the rapid manufacturing device is configured to form the relief void with a first planar inner surface and a second planar inner surface that intersect along a corner junction.

* * * * *